United States Patent
Kaushik et al.

(10) Patent No.: US 11,107,613 B2
(45) Date of Patent: Aug. 31, 2021

(54) ON-CHIP RESISTOR TRIMMING TO COMPENSATE FOR PROCESS VARIATION

(71) Applicant: STMicroelectronics International N.V., Schiphol (NL)

(72) Inventors: Mohit Kaushik, Muzaffar Nagar (IN); Anil Kumar, Greater Noida (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 16/668,023

(22) Filed: Oct. 30, 2019

(65) Prior Publication Data

US 2020/0161031 A1 May 21, 2020

Related U.S. Application Data

(60) Provisional application No. 62/769,068, filed on Nov. 19, 2018.

(51) Int. Cl.
*H01C 17/26* (2006.01)
*H01L 21/66* (2006.01)

(52) U.S. Cl.
CPC ........... *H01C 17/267* (2013.01); *H01L 22/20* (2013.01)

(58) Field of Classification Search
CPC ........ H01C 10/16; H01C 10/50; H01C 17/22; H01C 17/267; H01C 1/16; H01L 22/20
See application file for complete search history.

(56) References Cited

U.S. PATENT DOCUMENTS

| | | | |
|---|---|---|---|
| 6,381,491 B1 | 4/2002 | Maile et al. | |
| 2005/0127978 A1* | 6/2005 | Cranford, Jr. | H01C 17/22 327/334 |
| 2006/0290387 A1* | 12/2006 | Gossmann | H03M 1/1061 327/63 |
| 2008/0007368 A1* | 1/2008 | Kalb | H03H 11/28 333/17.3 |
| 2008/0012624 A1* | 1/2008 | Kamatani | H01L 27/0629 327/525 |
| 2010/0073121 A1* | 3/2010 | Grudin | H01C 17/267 338/25 |
| 2011/0163799 A1* | 7/2011 | Kuang | H01C 17/22 327/539 |
| 2016/0276070 A1* | 9/2016 | Michal | H01C 17/22 |
| 2020/0373042 A1* | 11/2020 | Potasek | H01C 1/16 |

* cited by examiner

*Primary Examiner* — Kyung S Lee
(74) *Attorney, Agent, or Firm* — Crowe & Dunlevy

(57) ABSTRACT

A resistance trimming circuit has a resolution of N=X+Y bits. Included is a first circuit with M resistors, where $M=2^X-1$, with each of the M resistors having a resistance of $R*(2^Y)*i$, i being an index having a value ranging from 1 to $2^X-1$. M switches are associated with the M resistors. Each of the M resistors is coupled between a first node and its one of the M switches, and each of the M switches couples its one of the M resistors to a second node. Included is a second circuit with P resistors, where $P=2^Y-1$, with each of the P resistors having a resistance of $R*i$. P switches are associated with the P resistors. Each of the P resistors is coupled between the second node and its one of the P switches, and each of the P switches selectively couples its one of the P resistors to a third node.

15 Claims, 3 Drawing Sheets

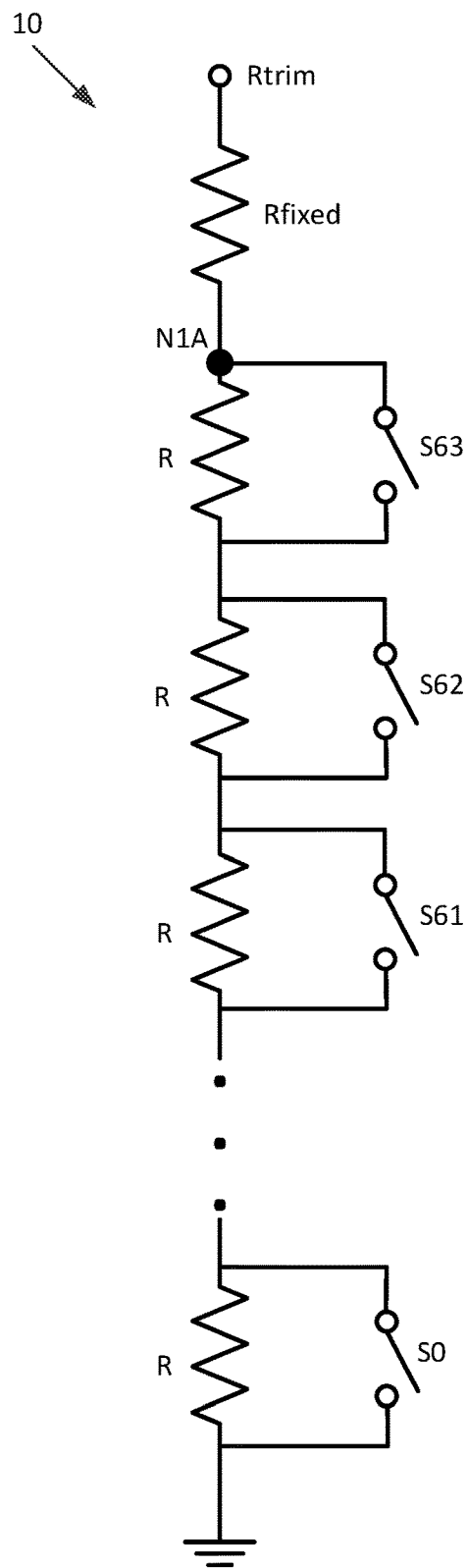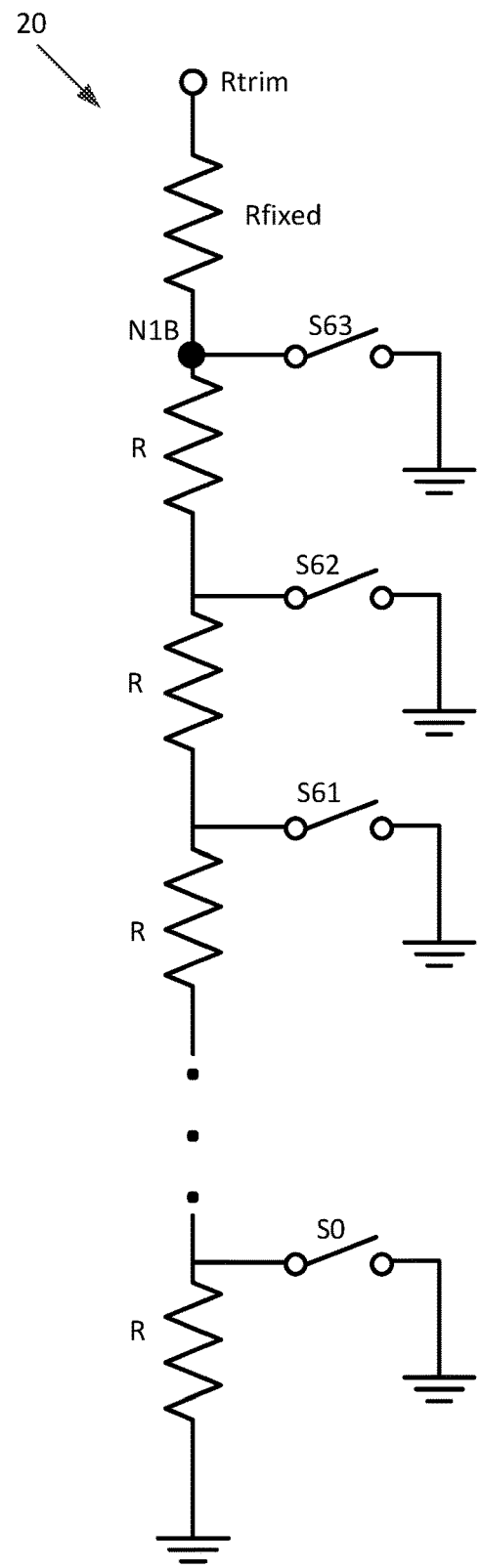
FIG. 1A
(Prior Art)
FIG. 1B
(Prior Art)

ON-CHIP RESISTOR TRIMMING TO COMPENSATE FOR PROCESS VARIATION

RELATED APPLICATION

This application claims priority from U.S. Provisional Application for Patent No. 62/769,068, filed Nov. 19, 2018, the contents of which are incorporated by reference in their entirety.

TECHNICAL FIELD

This application is directed to the field of integrated circuits, and in particular, to a circuit for on-chip resistor trimming to compensate integrated resistors for the variance in resistance that may occur due to process variation.

BACKGROUND

The integrated resistor is a commonly used component in integrated circuits, and such integrated circuits are ubiquitous in the modern world. Such integrated resistors are used in bias networks, reference voltage generation circuits, filters, amplifiers, and other essential components of integrated circuits. Unfortunately, such integrated resistors suffer from inferior accuracy as compared to discrete resistors, with their resistances varying due to process variation by as much as ±20% or more from the intended resistance.

This limitation of integrated resistors is well known. Therefore, attempts have been made at correcting or "trimming" such integrated resistors. Some such attempts include laser-trimming, electrical trimming, trimming through reconfiguration of resistor networks using fusible links, and the use of potentiometers to correct resistance.

A first sample trimming circuit 10 is shown in FIG. 1A. Here, where the resistance value of a resistor Rtrim is critical, a trimming circuit 10 is used to provide the resistance Rtrim, which is measured between the node labeled Rtrim and ground. As can be seen, the trimming circuit 10 includes a fixed resistor Rfixed coupled in series with 64 resistors R between the N1A node and ground, each resistor R having a respective switch S0 ... S63 that selectively shorts that resistor. Through control of these switches S0 ... S63, any combination of the resistors R can be selected, so that the value of Rtrim can be precisely set to the desired value.

A variant of this is shown in the trimming circuit 20 of FIG. 1B. Here, the trimming circuit 20 includes a fixed resistor Rfixed coupled in series with 64 resistors R between the N1B node and ground, each resistor R having a respective switch S0 ... S63 that selectively shunts that resistor to ground. Through selective control of these switches S0 ... S63, the value of Rtrim can be precisely set to the desired value.

While the trimming circuits 10 and 20 can effectively perform trimming, they are less than ideal due to area consumption, with each utilizing 64 resistors. In addition, they are also less than ideal due to the resulting number of switches (also 64) and control lines for the switches.

Therefore, further development in the area of resistor trimming circuits is still needed.

SUMMARY

Disclosed herein is a resistance trimming circuit that operates at a trimming resolution of N bits, where $X+Y=N$. The resistance trimming circuit includes first and second resistive circuits.

The first resistive circuit includes M resistors, where $M=2^X-1$, with each of the M resistors having a resistance that is equal to $R1i=R*(2^Y)*i\Omega$ and with i being an index having a value ranging from 1 to $2^X-1$. Therefore, a first of the M resistors has a resistance of $R11=R*(2^Y)*1\Omega$, a second of the M resistors has a resistance of $R12=R*(2^Y)*2\Omega$, a third of the M resistors has a resistance of $R13=R*(2^Y)*3\Omega$, and so on and so forth, such that a last of the M resistors has a resistance of $R1M=R*(2^Y)*(2^X-1)\Omega$.

M switches are respectively associated with the M resistors. Each of the M resistors is directly electrically coupled between a first node, N1, and its associated one of the M switches, and each of the M switches selectively couples its associated one of the M resistors to a second node N2.

The second resistive circuit includes P resistors, where $P=2^Y-1$, with each of the P resistors having a resistance that is equal to $R2i=R*i$ and with i being an index having a value ranging from 1 to $2^Y-1$. Therefore, that a first of the P resistors has a resistance equal to $R21=R*1$, and so on and so forth, such that a last of the P resistors has a resistance equal to $R2P=R*(2^Y-1)$.

P switches are respectively associated with the P resistors. Each of the P resistors is directly electrically coupled between the second node, N2, and its associated one of the P switches, and each of the P switches selectively couples its associated one of the P resistors to a third node, N3.

X and Y may be equal in some instances, but unequal in other instances. In a particular embodiment disclosed herein, N is 6, X is 3, and Y is 3.

M is equal to P in some instances, such as that of a particular embodiment disclosed herein.

BRIEF DESCRIPTION OF THE DRAWINGS

FIG. 1A is a schematic diagram of a prior art resistor trimming circuit.

FIG. 1B is a schematic diagram of a different prior art resistor trimming circuit.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein. In the below description, "R" is a base resistance value, and therefore numbers described as being multiples of R are multiples of the base resistance. For example, "R1" is equal to the base resistance R, while "R2" is equal to the base resistance R multiplied by 2.

Figure 2:
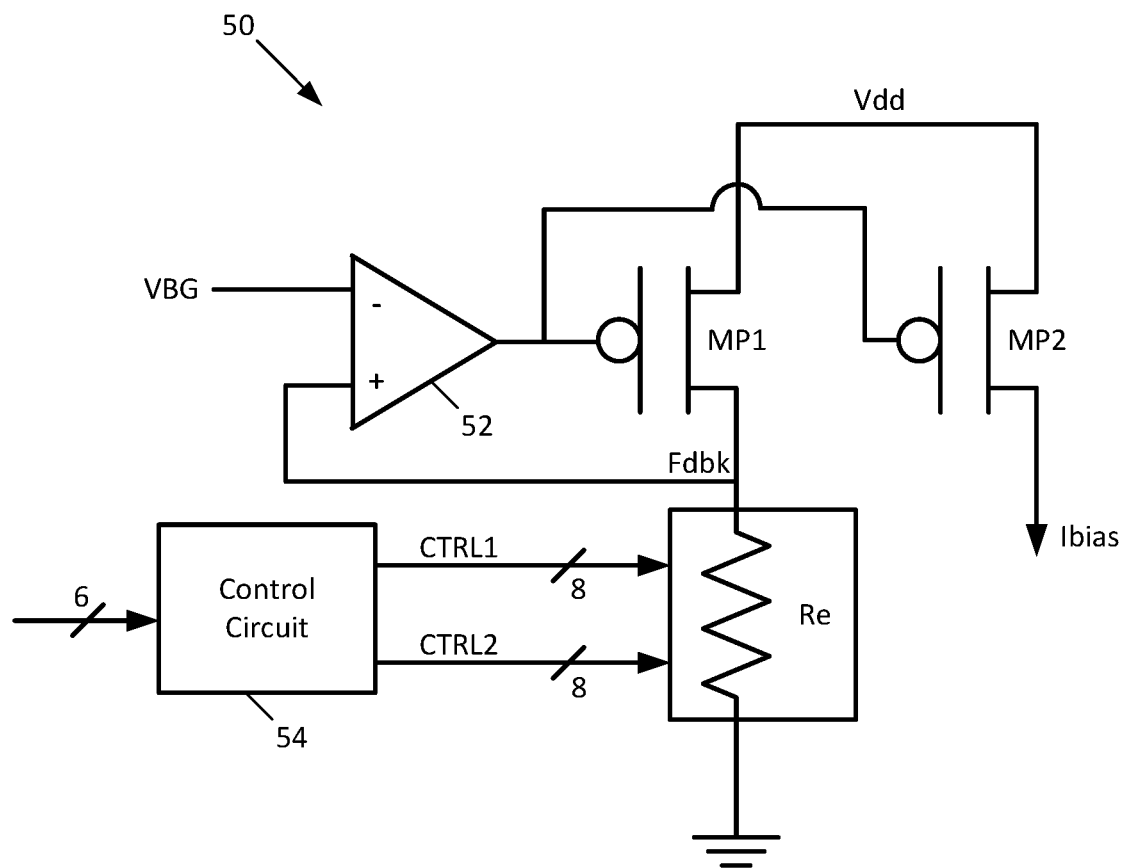
FIG. 2 is a schematic block diagram of a voltage to current converter using a feedback resistance which requires trimming.

A voltage to current converter 50 is now described with reference to FIG. 2. The voltage to current converter 50 includes an operational amplifier 52 having an inverting terminal coupled to receive an input voltage (for example, a bandgap voltage VBG), and a non-inverting terminal coupled to a feedback node Fdbk. A trimmed resistor circuit Re is coupled between the feedback node Fdbk and ground, and a control circuit 54 provides control signals to the trimmed resistor circuit Re that serve to adjust the resistance of the trimmed resistor circuit Re to match a desired resistance. A first PMOS transistor MP1 has its source coupled to a supply node Vdd, its gate coupled to the output of the operational amplifier 52, and its drain coupled to the feedback node Fdbk. A second PMOS transistor MP2 has its source coupled to the supply node Vdd, its gate coupled to the output of the operational amplifier 52, and its drain configured to provide a bias current Ibias.

In operation, the operational amplifier 52 compares the bandgap voltage VBG to the feedback signal at the feedback node Fdbk, and controls the PMOS transistors MP1, MP2 so as to convert the bandgap voltage VBG to the bias current Ibias. The cross corner spread of the bias current Ibias is directly determined by the spread (variance) of the trimmed resistor circuit Re over process corners. Since bias current spread is detrimental to the desired electrical performance of the voltage to current converter, it is particularly useful for the trimmed resistor circuit Re to include the fixed resistor Rfixed, so as to permit adjustment that keeps the bias current spread within an acceptable range.

The control circuit 54 generates control signals on two control buses, CTRL1 and CTRL2, each of which are shown as 8 bits (i.e. 8 lines). Calculation of the number of bits of these control buses CTRL1, CTRL2 in a generic case is now described. Where N bits of trimming resolution are desired, conventionally there would be $2^N$ control lines. However, with the trimmed resistor circuit Re as will be described below, $2^X+2^Y$ control lines are instead used, where X+Y=N. In the example shown, six bit trimming resolution is desired, such that N is 6. X and Y are equal in some embodiments, so in this example, X and Y are both set equal to 3. This means that a total of $2^3+2^3=16$ control lines are needed, which is provided by CTRL1 and CTRL2 each being 8 bit buses. This is far less than the $2^6=64$ control lines needed with a conventional approach.

Figure 3:
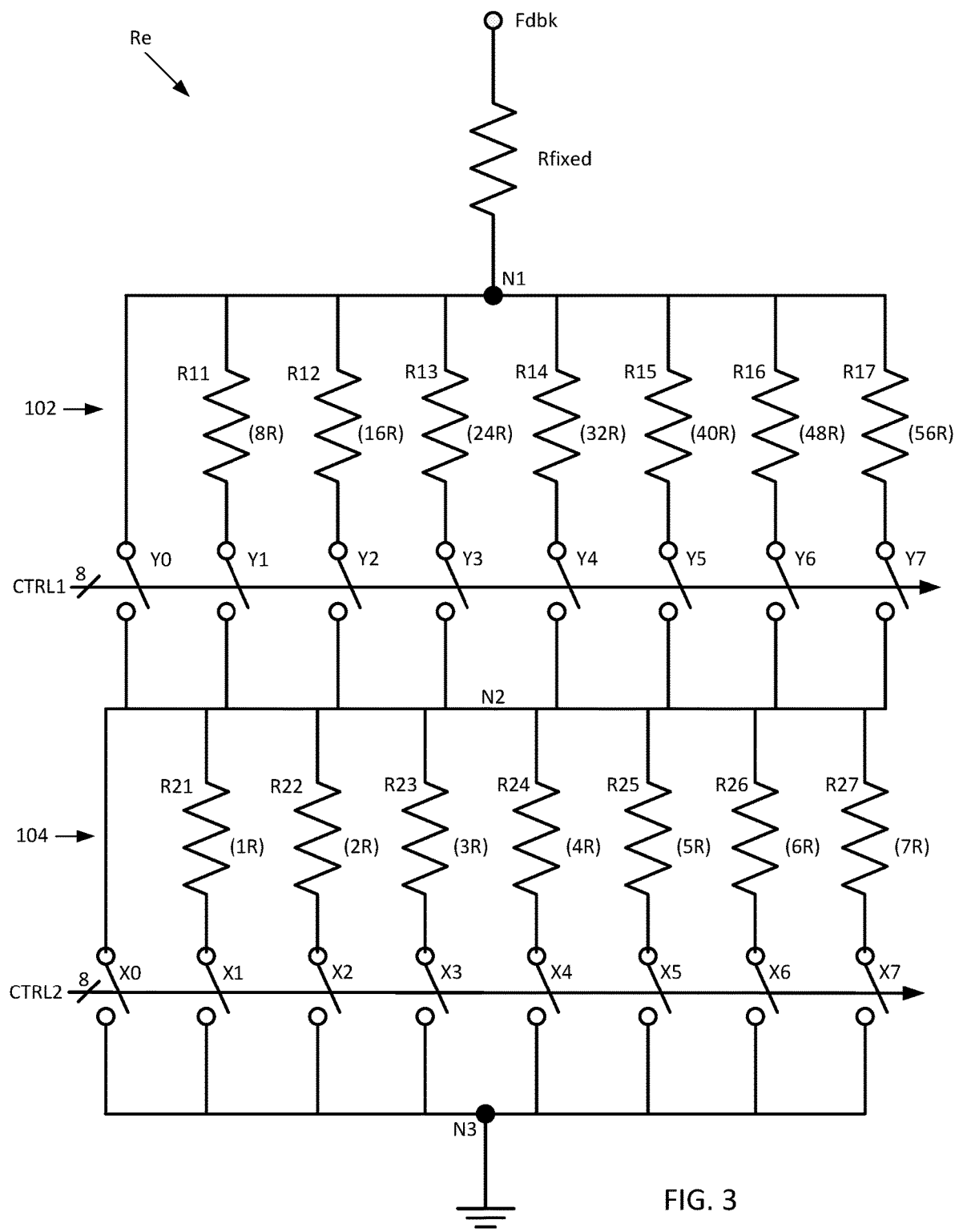
FIG. 3 is a schematic diagram of a resistor trimming circuit that operates to provide the feedback resistance of FIG. 2.

The trimmed resistor circuit Re is now described with additional reference to FIG. 3. The trimmed resistor circuit includes a fixed resistor Rfixed coupled between the feedback node Fdbk and a node N1. A first switched resistor circuit 102 is coupled between node N1 and node N2, and a second switched resistor circuit 104 is coupled between node N2 and N3. Node N3 is coupled to ground. The fixed resistor Rfixed provides the majority of the resistance provided by the trimmed resistor circuit Re, with the first and second switched resistor circuits 102, 104 then providing the remainder of the resistance, such that the total resistance provided by the trimmed resistor circuit Re matches a desired resistance.

The first switched resistor circuit 102 includes seven ($2^3-1$) resistors R11-R17, respectively having resistance values of 8R, 16R, 24R, 32R, 40R, 48R, and 56R and being coupled between node N1 and respective switches Y1-Y7. The switches Y1-Y7 are coupled between the resistors R11-R17 and node N2, and are controlled by respective different bits of the bus CTRL1. A switch Y0 is coupled between nodes N1 and N2 and is also controlled by a respective bit of the bus CTRL1.

The second switched resistor circuit 104 includes seven ($2^3-1$) resistors R21-R27, respectively having resistance values of 1R, 2R, 3R, 4R, 5R, 6R, and 7R and being coupled between node N2 and respective switches X1-X7. The switches X1-X7 are coupled between the resistors R21-R27 and node N3, and are controlled by respective different bits of the bus CTRL2. A switch X0 is coupled between nodes N2 and N3 and is also controlled by a respective bit of the bus CTRL2.

Through selective operation of the switches Y0-Y7 in response to control signal CTRL1 and X0-X7 in response to control signal CTRL2, any resistance value between 0R and 63R can be selected to be seen between nodes N1 and N3. This is due to the resistors of the first switched resistor circuit 102 each increasing in resistance value by the same multiple of 2 (here, $8=2^Y$), and the resistors of the second switched resistor circuit 104 each increasing in resistance value by incrementing to a next integer value, starting with unit resistance R. Unit resistance R is the precision tolerance of the trimming resistance. Stated another way, this is due to successive resistors of the first switched resistor circuit 102 each increasing by a same fixed integer multiple Q (here, Q would be $8=2^Y$), and with the second switched resistor circuit 104 having a total of ($Q-1=2^Y-1$) resistors, with each resistor increasing in resistance value by incrementing to a next integer value, starting with R (e.g. 1). Therefore, where the resistors of the first switched resistor circuit 102 each increase in resistance value by a multiple of 8 (e.g. 8, 16, 24, etc.), there will be 7 resistors of the second switched resistor circuit 104 having values from 1R to 7R.

The arrangements of the first switched resistor circuit 102 and second resistor circuit 104 will now be genericized. For a desired trimming resolution of N bits, where X+Y=N, the first switched resistor circuit 102 would include $2^X-1$ resistors, with each of those resistors having a resistance that is equal to $2^Y*R*$(which one of the $2^X-1$ resistors that resistor is, this being 1 . . . $2^X-1$), such that a first R11 of the $2^X-1$ resistors has a resistance of $2^Y*R*1$, such that a second R12 of the $2^X-1$ resistors has a resistance of $2^Y*R*2$, such that a third R13 of the $2^X-1$ resistors has a resistance of $2^Y*R*3$, and so on and so forth until a last R1($2^X-1$) of the $2^X-1$ resistors (here, R17) has a resistance of $2^Y*R*(2^X-1)$. The first switched resistor circuit 102 would include $2^X-1$ switches respectively associated with the $2^X-1$ resistors.

The second switched resistor circuit 104 would for this arrangement would include $2^Y-1$ resistors, with each of the $2^Y-1$ resistors having a resistance that is equal to R*(which one of the $2^Y-1$ resistors that resistor is), this being 1 . . . $2^Y-1$, such that a first R21 of the $2^Y-1$ resistors has a resistance of R*1 and such that a last R2($2^Y-1$) of the $2^Y-1$ resistors (here, R27) has a resistance of R*($2^Y-1$). The second switched resistor circuit 104 includes $2^Y-1$ switches respectively associated with the $2^Y-1$ resistors. Note that as described above, Y and X may be equal.

Through the use of this resistor trimming circuit Re, effective resistor trimming for a desired resolution of N bits, where X+Y=N, may be performed using $2^X-1+2^Y-1$ resistors, $2^X+2^Y$ switches, and $2^X+2^Y$ control lines. Sample values are shown in the chart below:

| N | X | Y | $2^N$ | $2^X + 2^Y$ | Savings of switches/lines |
|---|---|---|---|---|---|
| 6 | 3 | 3 | 64 | 16 | 48 |
| 7 | 3 | 4 | 128 | 24 | 104 |
| 8 | 4 | 4 | 256 | 32 | 224 |
| 9 | 5 | 4 | 512 | 48 | 464 |

This represents a drastic reduction in the number of switches and control lines as compared to the prior art, particularly as the trimming resolution increases. This saves significant space on an integrated circuit utilizing the resistor trimming circuit Re. This also helps reduce settling time due to a reduced amount of switching and a reduced number of parasitic capacitances.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A resistance trimming circuit, comprising:
for a trimming resolution of N bits, where X+Y=N:
a first resistive circuit comprising:
M resistors, where $M=2^X-1$, with each of the M resistors having a resistance that is equal to $R*(2^Y)*i$, with i being an index having a value ranging from 1 to $2^X-1$, such that a first of the M resistors has a resistance of $R*2^Y$, such that a second of the M resistors has a resistance of $R*2^Y*2$, such that a third of the M resistors has a resistance of $R*2^Y*3$, and such that a last of the M resistors has a resistance of $R*2^Y*(2^X-1)$;
M switches respectively associated with the M resistors;
wherein each of the M resistors is directly electrically coupled between a first node and its associated one of the M switches; and
wherein each of the M switches selectively couples its associated one of the M resistors to a second node; and
a second resistive circuit comprising:
P resistors, where $P=2^Y-1$, with each of the P resistors having a resistance that is equal to $R*i$, such that a first of the P resistors has a resistance equal to R, such that a last of the P resistors has a resistance equal to $R*(2^Y-1)$;
P switches respectively associated with the P resistors;
wherein each of the P resistors is directly electrically coupled between the second node and its associated one of the P switches; and
wherein each of the P switches selectively couples its associated one of the P resistors to a third node.

2. The resistance trimming circuit of claim 1, wherein X and Y are equal.

3. The resistance trimming circuit of claim 1, where N is 6, X is 3, and Y is 3.

4. The resistance trimming circuit of claim 1, wherein M is equal to P.

5. A circuit, comprising:
a first resistive network comprising:
M resistors having resistances which increase in resistance value R by a multiple of a fixed number $Q=2^Y$, such that a first of the M resistors has a resistance of $R*Q=R*2^Y$, with each subsequent one of the M resistors increasing in value by a multiple of Q, such that the Mth resistor has a resistance of $R*Q*M=R*2^Y*M$;
M switches respectively associated with the M resistors;
wherein each of the M resistors is directly electrically coupled between a first node and its associated one of the M switches; and
wherein each of the M switches selectively couples its associated one of the M resistors to a second node; and
a second resistive network comprising:
P resistors having resistances which increase linearly in resistance value by R, such that a first of the P resistors has a resistance value of R, with each subsequent one of the P resistors increasing in value by R such that the Pth resistor of the P resistors has a resistance value of $R*P$, wherein $P=Q-1$;
P switches respectively associated with the P resistors;
wherein each of the P resistors is directly electrically coupled between the second node and its associated one of the P switches; and
wherein each of the P switches selectively couples its associated one of the P resistors to a third node.

6. The circuit of claim 5, further comprising a fixed resistor coupled between a trimming resistance node and the first node, and a ground coupled to the third node.

7. The circuit of claim 5, further comprising an (M+1)th switch directly electrically coupled between the first and second nodes, and an (P+1)th switch directly electrically coupled between the second node and the third node.

8. The circuit of claim 5, wherein Q is 8 and R is a unit resistance for setting trimming precision.

9. The circuit of claim 5, further comprising a fixed resistor coupled between a trimming resistance node and the first node, a ground coupled to the third node, and an operational amplifier receiving as input a first voltage and a feedback signal, the feedback signal being a function of a resistance between the trimming resistance node and ground.

10. A resistance trimming circuit, comprising:
for a trimming resolution of N bits, where X+Y=N:
a resistive circuit comprising:
M resistors, where $M=2^X-1$, with each of the M resistors having a resistance that is equal to $R*(2^Y)*i$, with i being an index having a value ranging from 1 to $2^X-1$, such that a first of the M resistors has a resistance of $R*2^Y$, such that a second of the M resistors has a resistance of $R*2^Y*2$, such that a third of the M resistors has a resistance of $R*2^Y*3$, and such that a last of the M resistors has a resistance of $R*2^Y*(2^X-1)$;
M switches respectively associated with the M resistors;
wherein each of the M resistors is directly electrically coupled between a first node and its associated one of the M switches; and
wherein each of the M switches selectively couples its associated one of the M resistors to a second node.

11. The resistance trimming circuit of claim 10, wherein X and Y are equal.

12. The resistance trimming circuit of claim 10, where N is 6, X is 3, and Y is 3.

13. A resistance trimming circuit, comprising:
for a trimming resolution of N bits, where X+Y=N:
a resistive circuit comprising:
P resistors, where $P=2^Y-1$, with each of the P resistors having a resistance that is equal to $R*i$, such that a first of the P resistors has a resistance equal to R, such that a last of the P resistors has a resistance equal to $R*(2^Y-1)$;
P switches respectively associated with the P resistors;
wherein each of the P resistors is directly electrically coupled between a second node and its associated one of the P switches; and wherein each of the P switches selectively couples its associated one of the P resistors to a third node.

14. The resistance trimming circuit of claim 13, wherein X and Y are equal.

15. The resistance trimming circuit of claim 13, where N is 6, X is 3, and Y is 3.

* * * * *